United States Patent
Chiang et al.

(10) Patent No.: US 9,269,241 B2
(45) Date of Patent: Feb. 23, 2016

(54) TAMPER-RESISTANT SECURITY DEVICE

(71) Applicant: Sercomm Corporation, Taipei (TW)

(72) Inventors: Meng-Chien Chiang, Taipei (TW); Po-Tsung Chen, Taipei (TW)

(73) Assignee: SERCOMM CORPORATION, Taipei (TW)

(*) Notice: Subject to any disclaimer, the term of this patent is extended or adjusted under 35 U.S.C. 154(b) by 0 days.

(21) Appl. No.: 14/519,229

(22) Filed: Oct. 21, 2014

(65) Prior Publication Data

US 2015/0137973 A1    May 21, 2015

(30) Foreign Application Priority Data

Nov. 15, 2013   (CN) ............... 2013 2 0723883 U

(51) Int. Cl.
  *G08B 13/12*    (2006.01)
  *G08B 13/14*    (2006.01)
  *G01R 31/04*    (2006.01)
  *G08B 29/04*    (2006.01)

(52) U.S. Cl.
  CPC ............ *G08B 13/1409* (2013.01); *G01R 31/04* (2013.01); *G08B 29/046* (2013.01)

(58) Field of Classification Search
  CPC ........... G09G 5/00; G08B 29/06; G08B 29/14
  USPC ...................... 340/568.2, 652, 654, 656, 687; 174/502; 29/428, 432; 345/168, 173
  See application file for complete search history.

(56) References Cited

U.S. PATENT DOCUMENTS

| 5,574,612 | A | 11/1996 | Pak |
| 6,089,880 | A | 7/2000 | Miyagawa et al. |
| 8,059,095 | B2* | 11/2011 | Verstraelen ........ G08B 13/1427 345/158 |
| 8,802,981 | B2* | 8/2014 | Wallaert ............... F24F 11/00 174/489 |
| 2010/0101854 | A1 | 4/2010 | Wallaert et al. |
| 2013/0175905 | A1 | 7/2013 | Sanlaville |

OTHER PUBLICATIONS

Non-Final Office Action issued by the USPTO for U.S. Appl. No. 14/540,138, filed Nov. 13, 2014, mailed Dec. 18, 2015.

* cited by examiner

*Primary Examiner* — Toan N Pham
(74) *Attorney, Agent, or Firm* — McClure, Qualey & Rodack, LLP

(57) ABSTRACT

A security device comprises a mounting plate and a mounting device. The mounting plate, for being fixed to a surface, comprises a first electrical contact point and a second electrical contact point electrically connecting to the first electrical contact point. The mounting device is to be assembled to the mounting plate and comprises a third electrical contact point, a fourth electrical contact point and a detection circuit. The third electrical contact point is for contacting the first electrical contact point when the mounting device is assembled to the mounting plate. The fourth electrical contact point is for contacting the second electrical contact point when the mounting device is assembled to the mounting plate. The detection circuit is electrically connected to the fourth electrical contact point, for determining whether the fourth electrical contact point is electrically connected to the third electrical contact point.

16 Claims, 5 Drawing Sheets

TAMPER-RESISTANT SECURITY DEVICE

This application claims the benefit of People's Republic of China application Serial No. 201320723883.X, filed on Nov. 15, 2013, the subject matter of which is incorporated herein by reference.

BACKGROUND

1. Field of the Invention

The invention relates in general to a security device, and more particularly to a tamper-resistant security device.

2. Description of the Related Art

A company or a residence may be deployed with a security system.

A central control of the security system may link to the sensors disposed on several control points respectively. Through the central control, a security function of the sensors may be activated. Once a state is changed, for example, a window or a door on which a sensor is disposed is opened, the central control may generate an alarm and/or contact with a security clerk in back-end.

As described above, such central control of the security system is very important. If the central control is tampered, the entire system may be compromised. Thus, such central control generally has a tamper switch for preventing tamper by unauthorized persons, such as an illegal intruder.

Referring to FIGS. 1A and 1B, FIG. 1A illustrates a diagram of a central control 10 of a security system, and FIG. 1B illustrates a diagram of a tamper switch 12 disposed on the central control 10. As illustrated In FIG. 1A, the central control 10 may be electrically connected to a relevant socket (disposed on a corresponding position on a wall surface) through a plug 11 thereof to obtain a required power supply. The central control 10 is disposed on the corresponding wall surface by a rear surface 10$b$ thereof.

In addition, as illustrated in FIG. 1A and FIG. 1 B, the tamper switch 12 is located inside the central control 10 and has an elastic structure 120 and a terminal 121. The terminal 121 is outwardly extended or projected from a hole 101 of the rear surface 10$b$. When the central control 10 is disposed on the wall surface, the elastic structure 120 is compressed to deform inwardly. As a result, the central control 10 may determine that it hasn't be dismantled. When the central control 10 is detached from the wall surface, the elastic structure 120 stretches to deform outwardly. As a result, the central control 10 may determine that it has been dismantled and then generate an alarm signal.

The tamper switch 12 has large size, and accordingly the inside space of the central control 10 is excessively occupied. Furthermore, the tamper switch 12 needs considerable cost. In addition, mist, dust, static electricity, etc. may enter the inside of the central control 10 through the hole 101 and damage a circuit component.

SUMMARY

The invention is directed to a tamper-resistant security device to resolve the above problems.

According to one embodiment of the present invention, a security device is provided. The security device comprises a mounting plate and a mounting device. The mounting plate, for being fixed to a surface, comprises a first electrical contact point and a second electrical contact point electrically connecting to the first electrical contact point. The mounting device is to be assembled to the mounting plate and comprises a third electrical contact point, a fourth electrical contact point and a detection circuit. The third electrical contact point is for contacting the first electrical contact point when the mounting device is assembled to the mounting plate. The fourth electrical contact point is for contacting the second electrical contact point when the mounting device is assembled to the mounting plate. The detection circuit is electrically connected to the fourth electrical contact point, for determining whether the fourth electrical contact point is electrically connected to the third electrical contact point.

According to another embodiment of the present invention, a security device is provided. The security device comprises a mounting plate and a mounting device. The mounting plate, for being fixed to a surface, comprises a first electrical contact point and a second electrical contact point being electrically short with the first electrical contact point. The mounting device is to be assembled to the mounting plate and comprises a third electrical contact point, a fourth electrical contact point and a detection circuit. The third electrical contact point is for contacting the first electrical contact point when the mounting device is assembled to the mounting plate. The fourth electrical contact point is for contacting the second electrical contact point when the mounting device is assembled to the mounting plate. The detection circuit is electrically connected to the fourth electrical contact point, for determining whether the fourth electrical contact point is electrically short with the third electrical contact point.

The above and other aspects of the invention will become better understood with regard to the following detailed description of the preferred but non-limiting embodiment(s). The following description is made with reference to the accompanying drawings.

DETAILED DESCRIPTION

Figure 1A:
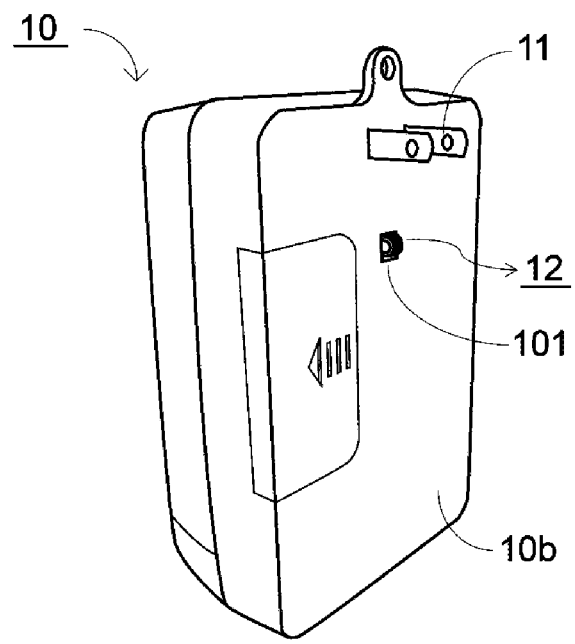
FIG. 1A illustrates a diagram of a central control of a security system.
Figure 1B:
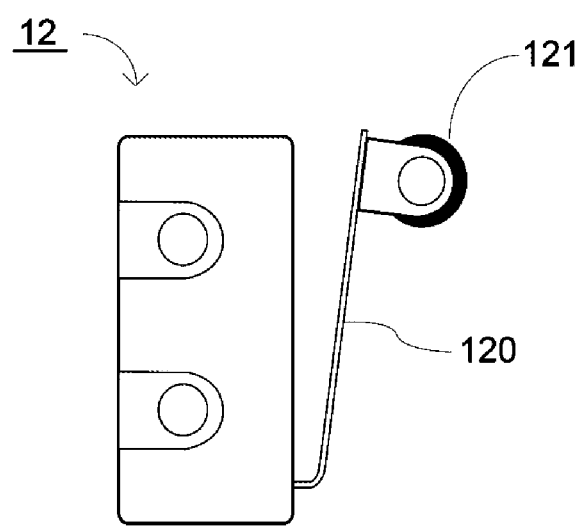
FIG. 1B illustrates a diagram of a tamper switch disposed on the central control.
Figure 2:
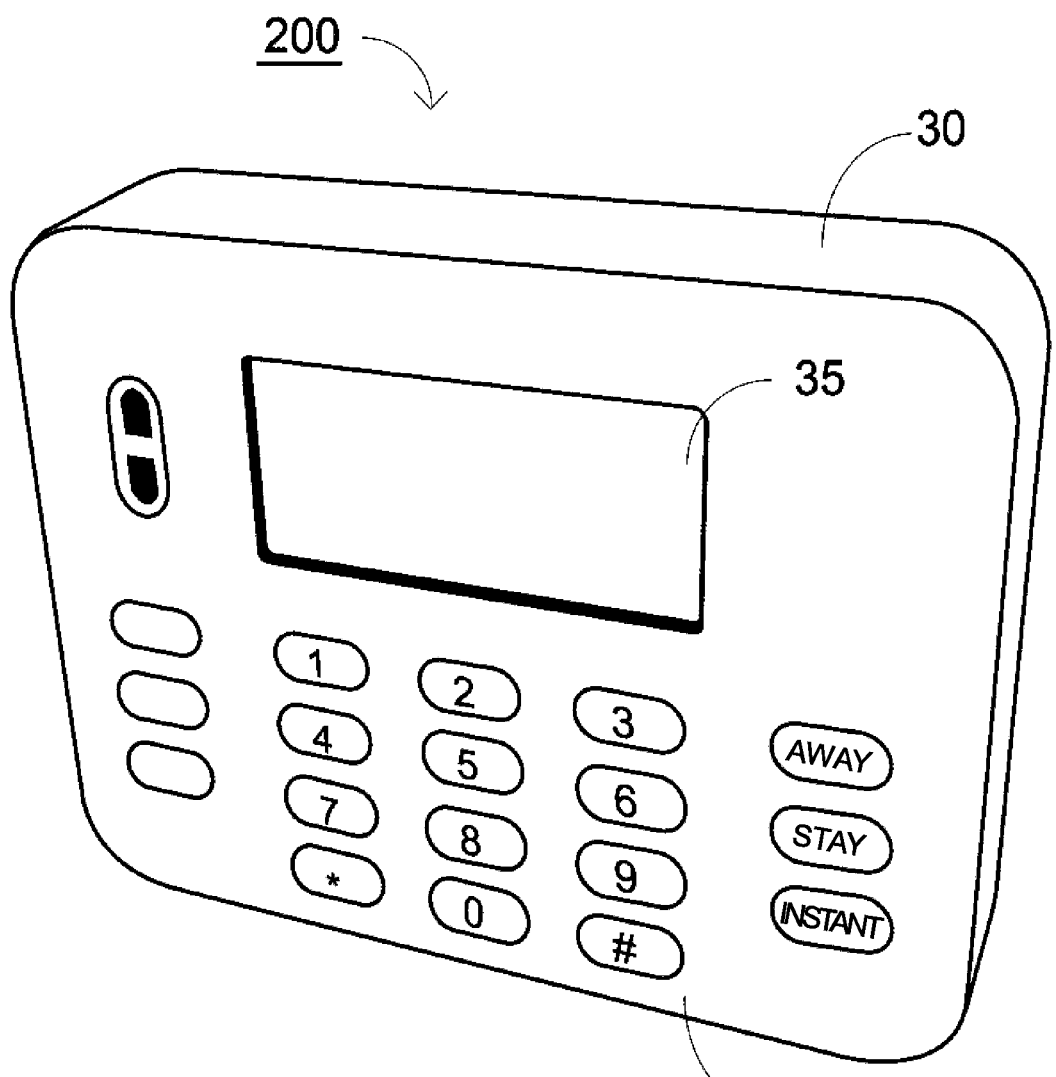
FIG. 2 illustrates a three-dimensional diagram of a security device according to an embodiment of the invention.

Referring to FIG. 2, a three-dimensional diagram of a security device 200 according to an embodiment of the invention is illustrated. The security device 200 is characterized by two-piece type structure. That is, the security device 200 comprises a mounting plate 20 (illustrated in FIG. 3B) and a mounting device 30 which may be assembled to the mounting plate 20.

The security device 200 of the present embodiment may be disposed on a surface near an entrance or doorway. First, the mounting plate 20 may be fixed to a surface, such as a surface on a wall. Then, the mounting device 30 may be directly assembled to the mounting plate 20 and is disposed on the surface.

The security device 200 of the present embodiment constitutes a part of a security system. As illustrated in FIG. 2, the mounting device 30 further comprises a user interface 31, through which a user may control the security system. The security system further comprises a plurality of sensors disposed on a plurality of control points respectively, such that the user may control the sensors by using the user interface 31 of the mounting device 30.

For example, the mounting device 30 is a keypad having physical keys or a touch panel for receiving an instruction or a password from the user. In addition, the mounting device 30 further comprises a display screen 35 for displaying information to the user. The security device 30 also may use a sensing technique, such as radio frequency identification (RFID), for recognizing an identity and performing an access control.

Figure 3A:
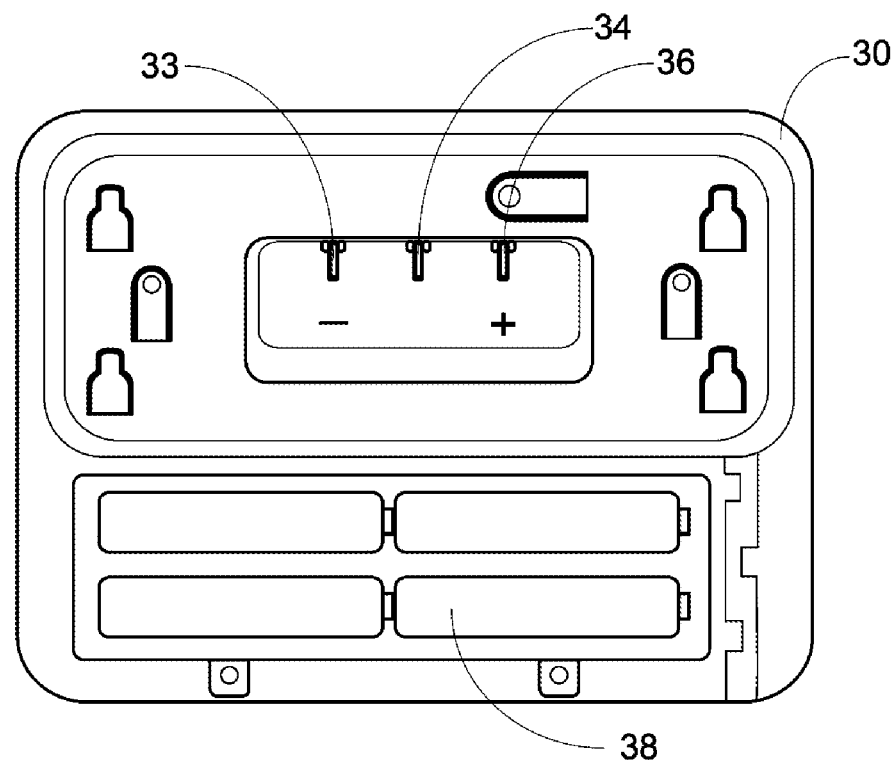
FIG. 3A illustrates a rear view of the mounting device.
Figure 3B:
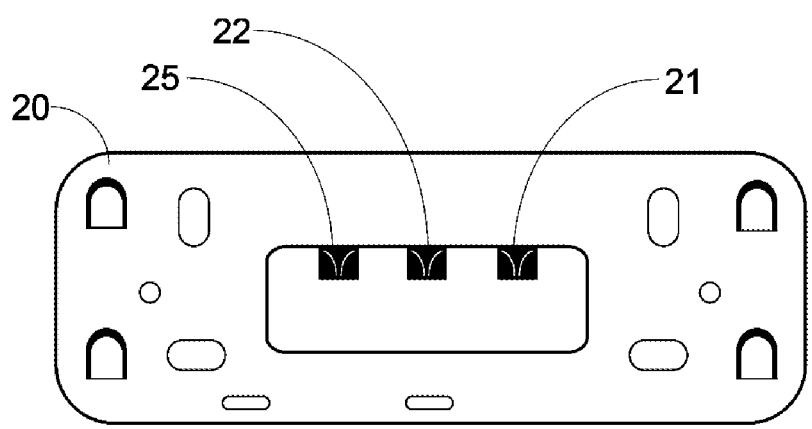
FIG. 3B illustrates a front view of the mounting plate.
Figure 3C:
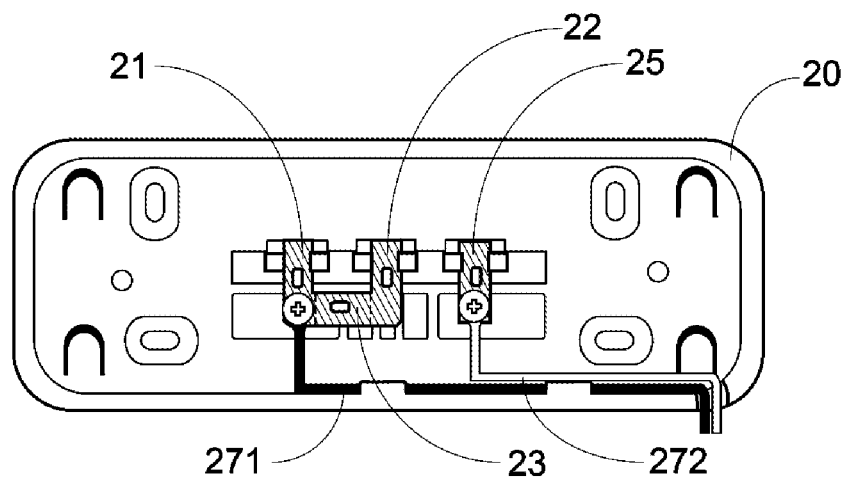
FIG. 3C illustrates a rear view of the mounting plate.

Referring to FIGS. 3A to 3C, FIG. 3A illustrates a rear view of the mounting device 30, FIG. 3B illustrates a front view of the mounting plate 20, and FIG. 3C illustrates a rear view of the mounting plate 20. As illustrated in the figures, the mounting plate 20 further comprises a first electrical contact point 21, a second electrical contact point 22 and a fifth electrical contact point 25. The mounting device 30 comprises a third electrical contact point 33, a fourth electrical contact point 34 and a sixth electrical contact point 36. When the mounting device 30 is assembled to the mounting plate 20, the electrical contact points 33, 34, and 36 contacts the electrical contact points 21, 22, and 25, respectively.

The mounting plate 20 provides DC power through the electrical contact points 21 and 25. Specifically, the electrical contact points 21 and 25 are electrically connected to a first wire 271 and a second wire 272 respectively. The first wire 271 and the second wire 272 may be connected to a transformer which may transfers AC power provided by a socket to DC power. When the mounting device 30 is assembled to the mounting plate 20, the third electrical contact point 33 and the sixth electrical contact point 36 of the mounting device 30 may be electrically connected to the first electrical contact point 21 and the fifth electrical contact point 25 respectively to receive the DC power for operating.

In the present embodiment, the first electrical contact point 21, the fifth electrical contact point 25 and the second electrical contact point 22 are sockets, and the third electrical contact point 33, the sixth electrical contact point 36 and the fourth electrical contact point 34 are plate-shape plugs. Alternatively, each electrical contact point of the mounting plate 20 may be a plug, while each electrical contact point of the mounting device 30 may be a socket.

In addition, the mounting device 30 further comprises a set of batteries 38. When the mounting device 30 can't receive the DC power from the mounting plate 20 (e.g., when power is off), the batteries 38 may provide reserved power. Furthermore, the batteries 38 may be rechargeable batteries. When the mounting device 30 is assembled to the mounting plate 20, the batteries 38 may be charged through the DC power.

Figure 4:
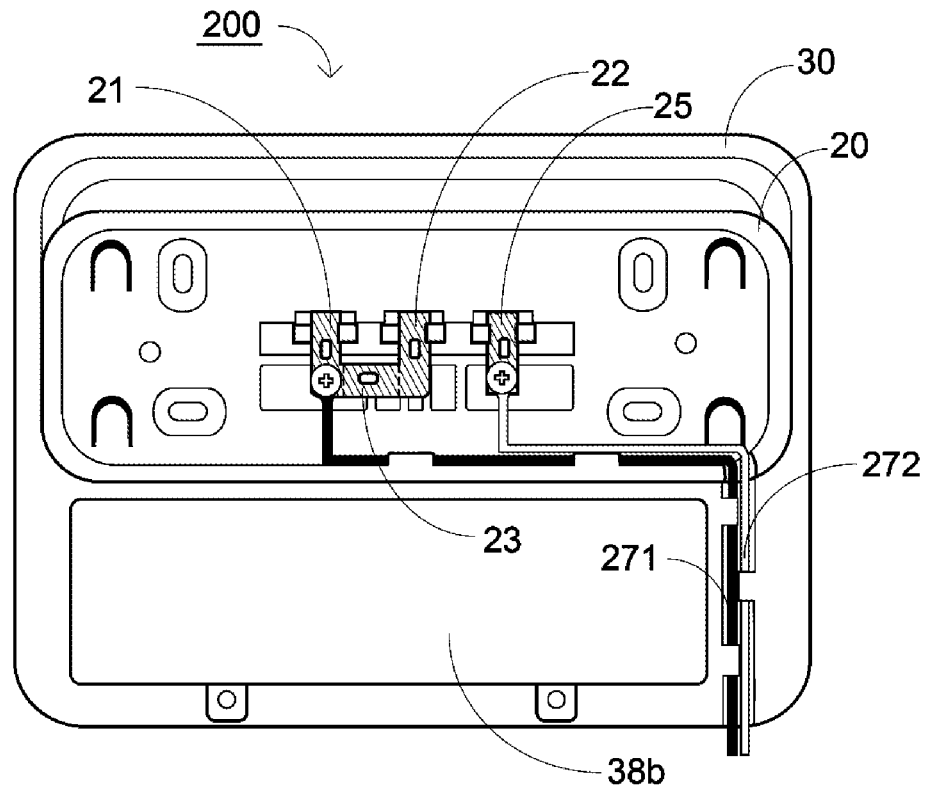
FIG. 4 illustrates a diagram of the mounting device being assembled to the mounting plate.

Referring to FIG. 4, FIG. 4 illustrates a diagram of the mounting device 30 being assembled to the mounting plate 20. The mounting device 30 may cover the batteries 38 with a cover 38b. Since the mounting device 30 has a structure corresponding to that of the mounting plate 20, the mounting plate 20 may be firmly engaged with the rear of the mounting device 30. That is, a corresponding recess may be formed on the rear of the mounting device 30, wherein recess may be matched with a size and/or a shape of the mounting plate 20. Accordingly, when the mounting device 30 is assembled to the mounting plate 20, an exposed portion (such as the cover 38b) of the rear of the mounting device 30 may be flatly attached to the surface where the mounting plate 20 is fixed to.

The first electrical contact point 21 of the mounting plate 20 is electrically connected to or short with the second electrical contact point 22 of the mounting plate 20. Furthermore, the third electrical contact point 33 of the mounting device 30 is not electrically connected to or is isolated from the fourth electrical contact point 34 when the mounting device 30 is not assembled to the mounting plate 20. As illustrated in FIGS. 3C or 4, the first electrical contact point 21 is electrically connected to/electrically short with the second electrical contact point 22 through a conductive sheet 23 (such as metal sheet), such that when the mounting device 30 is assembled to the mounting plate 20, the third electrical contact point 33 is electrically connected to/electrically short with the fourth electrical contact point 34.

Figure 5:
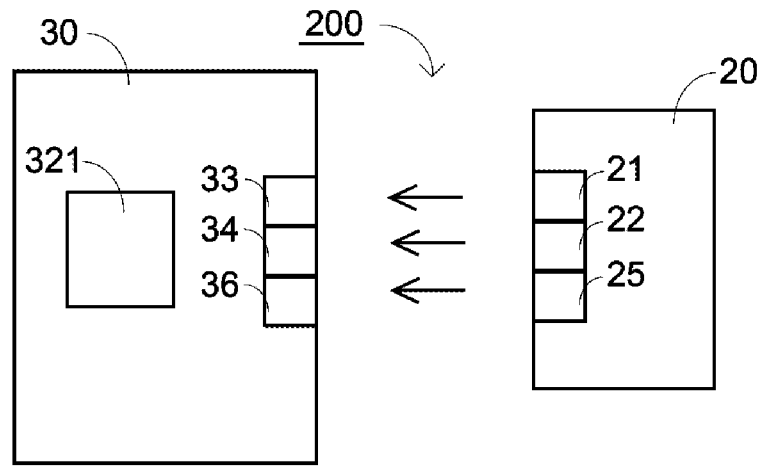
FIG. 5 illustrates a function block of the security device.
Figure 6:
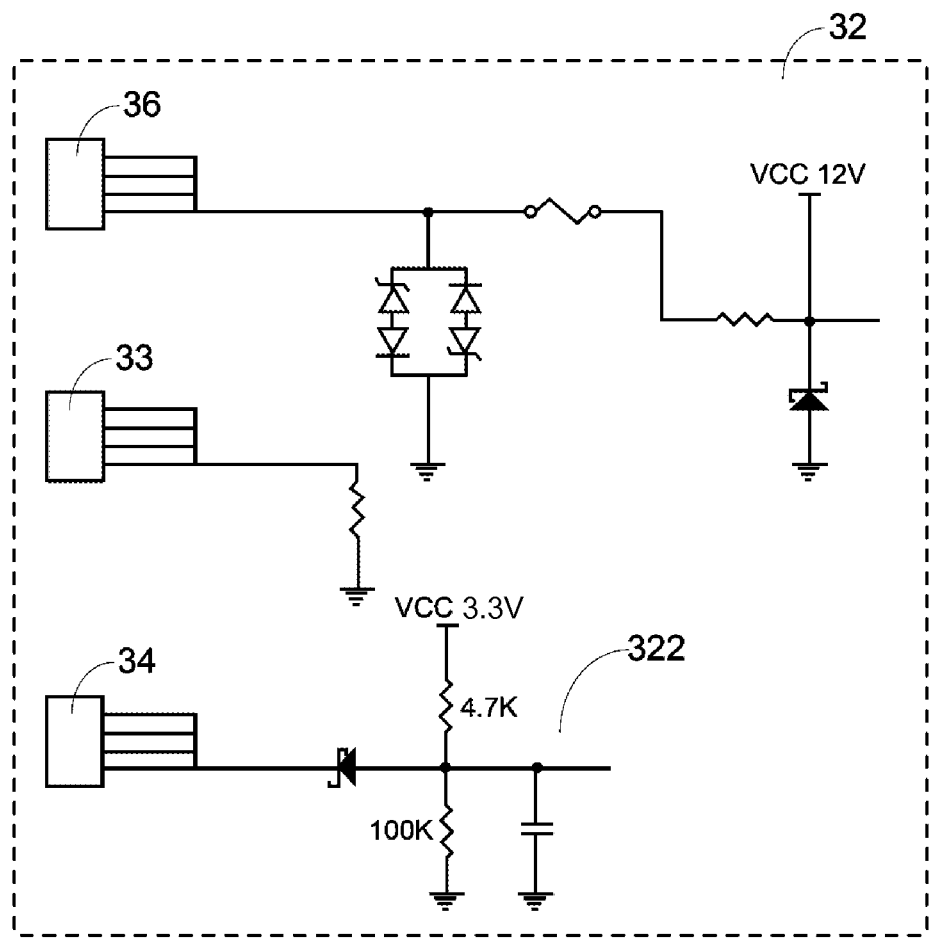
FIG. 6 illustrates a circuit design diagram of the mounting device.

Referring to FIGS. 5 and 6, FIG. 5 illustrates a function block of the security device 200, and FIG. 6 illustrates a circuit design diagram of the mounting device 30. As illustrated in FIGS. 5 and 6, the mounting device 30 further comprises a circuit board 32, a detection circuit 322 and a processor 321. The detection circuit 322 and the processor 321 are disposed on the circuit board 32, the processor 321 is electrically connected to the detection circuit 322, and the fourth electrical contact point 34 is electrically connected to the detection circuit 322.

The electrical contact points 33 and 36 of the mounting device 30 severs as terminals for receiving the DC power, and the fourth electrical contact point 34 merely serves as a terminal for detecting. The detection circuit 322 is used for determining whether the fourth electrical contact point 34 is electrically connected to or electrically short with the third electrical contact point 33 and accordingly determining whether the mounting device 30 is assembled to the mounting plate 20 or detached from the mounting plate 20 (that is, disassembled).

Specifically, when the mounting device 30 is assembled to the mounting plate 20, the fourth electrical contact point 34 contacts the second electrical contact point 22 and is electrically connected to or electrically short with the first electrical contact point 21 and the third electrical contact point 33 through the conductive sheet 23. Conversely, when the mounting device 30 is not assembled to the mounting plate 20, the fourth electrical contact point 34 is not electrically connected to or is isolated from the third electrical contact point 33. The detection circuit 322 may determine whether the mounting device 30 is assembled to the mounting plate 20 according to the changing of voltage level of the fourth electrical contact point 34.

For example, as illustrated in FIG. 6, the sixth electrical contact point 36 serves as a driving terminal for receiving 12 volts DC power, and the third electrical contact point 33 serves as a grounding terminal (0 volt) on the DC power. When the mounting device 30 is not assembled to the mounting plate 20, the third electrical contact point 33 and the fourth electrical contact point 34 are not electrically connected to each other, and the mounting device 30 may receive DC power from the batteries 38. The detection circuit 322 may generate a first level signal, e.g. of 3.3 volts. When the mounting device 30 is assembled to the mounting plate 20, the third electrical contact point 33 and the fourth electrical contact point 34 are electrically connected to each other, and the detection circuit 322 may generate a second level signal, e.g. of 3.15 volts (which is different from or less than the first level).

As described above, when the mounting device 30 is not assembled to the mounting plate 20, the detection circuit 322 may obtain a high voltage level (High), and when the mounting device 30 is assembled to the mounting plate 20, the detection circuit 322 may obtain a low voltage level (Low). According to the change of voltage level, when the detection circuit 322 determines that the third electrical contact point 33 is not electrically connected to the fourth electrical contact point 34 (High), the processor 321 generates an alarm signal to show the detachment state between the mounting device 30 and the mounting plate 20. For example, the alarm signal may be a siren sound or a message to the back-end, so as to protect the security device 200 and the entire system as a whole.

A variation design may be implemented in other embodiment. For example, the first level signal and the second level signal may be transferred to the processor 321, and the changing of the voltage level is determined by the processor 321. In such an embodiment, the processor further functions as the aforementioned detection circuit.

In above embodiment, the first electrical contact point 21 is electrically connected to/electrically short with the second electrical contact point 22; in other embodiment, the impedance value between the first electrical contact point 21 and the second electrical contact point 22 may be substantially greater than 0.

In above embodiment, the operation power is exemplified by the DC power, and the circuit is just required to determines whether one of the grounding terminal and the driving terminal is electrically connected to (or electrically short with) the detecting terminal.

As described above, the circuit design makes it possible to determine the corresponding relationship between the mounting device and the mounting plate. As a result, the security operation of the entire security system may be protected. In comparison with the conventional tamper switch, the electrical contact points (or terminals) and electrical connection structure of the present embodiment may reduce the occupied space and considerable cost. In addition, a hole formed on the rear of the mounting device is relatively small, preventing mist, dust and static electricity from entering the housing.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A security device, comprising:
   a mounting plate, for being fixed to a surface, comprising a first electrical contact point and a second electrical contact point electrically connecting to the first electrical contact point; and
   a mounting device to be assembled to the mounting plate, comprising:
      a third electrical contact point for contacting the first electrical contact point when the mounting device is assembled to the mounting plate; and
      a fourth electrical contact point for contacting the second electrical contact point when the mounting device is assembled to the mounting plate; and
      a detection circuit electrically connected to the fourth electrical contact point, for determining whether the fourth electrical contact point is electrically connected to the third electrical contact point.

2. The security device according to claim 1, wherein the third electrical contact point is isolated from the fourth electrical contact point when the mounting device is not assembled to the mounting plate.

3. The security device according to claim 1, wherein the mounting plate further comprises a fifth electrical contact point and provides direct current (DC) power through the first electrical contact point and the fifth electrical contact point; the mounting device further comprises a sixth electrical contact point for contacting the fifth electrical contact point when the mounting device is assembled to the mounting plate, and the mounting device receives the DC power through the third electrical contact point and the sixth electrical contact point.

4. The security device according to claim 1, wherein the mounting device comprises:
   a battery for providing a reserved operation power;
   a circuit board on which the detection circuit is disposed; and
   a processor, disposed on the circuit board and electrically connecting to the detection circuit, the processor is configured to generate a warning signal when the detection circuit determines that the fourth electrical contact point is not electrically connected to the third electrical contact point.

5. The security device according to claim 1, wherein the detection circuit generates a first level signal having a first level when the mounting device is not assembled to the mounting plate, and the detection circuit generates a second level signal having a second level when the mounting device is assembled to the mounting plate, wherein the second level is different from the first level.

6. The security device according to claim 1, wherein the security device constitutes a part of a security system, the security system comprises a plurality of sensors, and the mounting device of the security device is wirelessly linked with the sensors.

7. The security device according to claim 6, wherein the mounting device comprises a user interface for being operated by a user to control the security system.

8. The security device according to claim 1, wherein the mounting device is a keypad.

9. A security device, comprising:
   a mounting plate, for being fixed to a surface, comprising a first electrical contact point and a second electrical contact point being electrically short with the first electrical contact point; and
   a mounting device to be assembled to the mounting plate, comprising:
      a third electrical contact point for contacting the first electrical contact point when the mounting device is assembled to the mounting plate; and
      a fourth electrical contact point for contacting the second electrical contact point when the mounting device is assembled to the mounting plate; and
      a detection circuit electrically connected to the fourth electrical contact point, for determining whether the fourth electrical contact point is electrically short with the third electrical contact point.

10. The security device according to claim 9, wherein the third electrical contact point is isolated from the fourth electrical contact point when the mounting device is not assembled to the mounting plate.

11. The security device according to claim 9, wherein the mounting plate further comprises a fifth electrical contact point and provides DC power through the first electrical contact point and the fifth electrical contact point;
   the mounting device further comprises a sixth electrical contact point for contacting the fifth electrical contact point when the mounting device is assembled to the mounting plate, and the mounting device receives the DC power through the third electrical contact point and the sixth electrical contact point.

12. The security device according to claim 9, wherein the mounting device comprises:

a battery for providing a reserved operation power;

a circuit board on which the detection circuit is disposed; and a processor, disposed on the circuit board and electrically connecting to the detection circuit, configured to generate a warning signal when the detection circuit determines that the third electrical contact point is not electrically short with the fourth electrical contact point.

13. The security device according to claim 9, wherein the detection circuit generates a first level signal having a first level when the mounting device is not assembled to the mounting plate, and the detection circuit generates a second level signal having a second level when the mounting device is assembled to the mounting plate, wherein the second level is different from the first level.

14. The security device according to claim 9, wherein the security device constitutes a part of a security system, the security system comprising a plurality of sensors, and the mounting device of the security device is wirelessly linked with the sensors.

15. The security device according to claim 14, wherein the mounting device comprises a user interface for being operated by a user to control the security system.

16. The security device according to claim 9, wherein the mounting device is a keypad.

* * * * *